(12) United States Patent
Ishio et al.

(10) Patent No.: US 6,925,885 B2
(45) Date of Patent: Aug. 9, 2005

(54) PRESSURE SENSOR

(75) Inventors: Seiichiro Ishio, Kariya (JP); Yasutoshi Suzuki, Okazaki (JP)

(73) Assignee: Denso Corporation, Kariya (JP)

( * ) Notice: Subject to any disclaimer, the term of this patent is extended or adjusted under 35 U.S.C. 154(b) by 182 days.

(21) Appl. No.: 10/309,889

(22) Filed: Dec. 5, 2002

(65) Prior Publication Data

US 2003/0154796 A1 Aug. 21, 2003

(30) Foreign Application Priority Data

Feb. 21, 2002 (JP) .................................. 2002-045186

(51) Int. Cl.$^7$ ............................................ G01L 9/02
(52) U.S. Cl. ......................... 73/719; 73/715; 73/723; 73/726
(58) Field of Search ................... 73/700–756

(56) References Cited

U.S. PATENT DOCUMENTS

| 5,207,102 A | | 5/1993 | Takahashi et al. |
| 5,272,954 A | | 12/1993 | Crouch et al. |
| 5,509,312 A | * | 4/1996 | Donzier et al. ............... 73/706 |
| 5,900,554 A | * | 5/1999 | Baba et al. ................... 73/725 |
| 5,948,991 A | | 9/1999 | Nomura et al. |
| 6,049,120 A | | 4/2000 | Otani et al. |
| 6,169,316 B1 | | 1/2001 | Sakai et al. |
| 6,201,285 B1 | | 3/2001 | Iwata et al. |
| 6,260,417 B1 | * | 7/2001 | Watanabe et al. ............. 73/754 |
| 6,286,372 B1 | * | 9/2001 | Von Rauch .................. 73/716 |

FOREIGN PATENT DOCUMENTS

| EP | 0552017 | 1/1993 |
| EP | 0890830 | 6/1998 |
| JP | A-H09-61271 | 3/1997 |
| WO | WO 96/26424 | 8/1996 |

OTHER PUBLICATIONS

U.S. Appl. No. 09/547,457, filed Apr. 12, 2000, Ishio et al.

* cited by examiner

*Primary Examiner*—Edward Lefkowitz
*Assistant Examiner*—Jermaine Jenkins
(74) *Attorney, Agent, or Firm*—Posz & Bethards, PLC

(57) ABSTRACT

A pressure sensor includes a sensor element, and a resin package member that holds the sensor element. The sensor element is constructed by a semiconductor, and is capable of externally outputting an electric signal in accordance with strain generated when force is applied thereto. The sensor element is directly adhered to the package member via an adhesive layer that has Young's modulus in a range between $2.45 \times 10^3$ Pa and $2.06 \times 10^4$ Pa. Further the adhesive layer has a thickness equal to or more than 110 $\mu$m. Accordingly, the pressure sensor effectively restricts a variation in a sensor characteristic due to a thermal change.

13 Claims, 3 Drawing Sheets

PRESSURE SENSOR

CROSS REFERENCE TO RELATED APPLICATIONS

This application is based on and incorporates herein by reference Japanese Patent Application No. 2002-45186 filed on Feb. 21, 2002.

FIELD OF THE INVENTION

The present invention relates to a pressure sensor in which a sensor element is mounted in a resin package. In the pressure sensor, the sensor element is directly adhered to the resin package through an adhesive layer.

BACKGROUND OF THE INVENTION

In JP-P2000-356561A, a pressure sensor, includes a semiconductor a sensor element adhered to a lead frame and mounted in a resin package member via the lead frame. Further, the pressure sensor is provided with a non-contact space between the package member and an area where the sensor element is mounted in the lead frame. The sensor is thereby restricted from thermal hysteresis. Here, thermal hysteresis is a phenomenon in which sensor characteristic changes from an initial characteristic due to a cooling-heating cycle with repeat of high and low temperatures. However, in view of cost reduction, it has been recently desired that the sensor element is directly adhered to the package member with an adhesive without the lead frame.

When the sensor element is mounted in the package member via the lead frame, surfaces of a lead portion and land portion in the lead frame are located on the same plane. Therefore, a level gap (step portion) is formed between surfaces of the lead portion and the sensor element mounted on the island portion, and is necessary to bond the land portion and the sensor element with a wire. Here, to upgrade wire-bonding performance, the surfaces of the sensor element and the lead portion are preferably on the same plane.

Removal of the island portion under the sensor therefore leads to flexible designing of the component layout to possibly set the two bonded surfaces on the same plane. It has been hence desired that the sensor is adhered on the package member with an adhesive layer without using the lead frame.

However, when the above direct adhesion of the sensor element to the package member is performed, the thermal hysteresis is readily generated by a difference of thermal expansion coefficients among the sensor, the adhesive and the package member.

SUMMARY OF THE INVENTION

It is an object of the present invention to restrict variation of a sensor characteristic due to thermal fluctuation in a pressure sensor in which a sensor element is directly adhered to a package member via an adhesive layer.

To achieve the above and other objects, a pressure sensor is provided with a sensor element which is directly adhered to a package member via an adhesive layer that has Young's modulus in a range between $2.45 \times 10^3$ Pa and $2.06 \times 10^4$ Pa. Therefore, the thermal fluctuation of the sensor characteristic can be effectively restricted.

Preferably an adhesive layer contains therein a plurality of beads. Therefore the adhesive layer having the Young's modulus in a range between $2.45 \times 10^3$ Pa and $2.06 \times 10^4$ Pa can be readily formed. When an adhesive layer has a thickness of equal to or more than 110 $\mu$m, the advantage for restricting the variation of the sensor characteristic can be further improved.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

Figure 1:
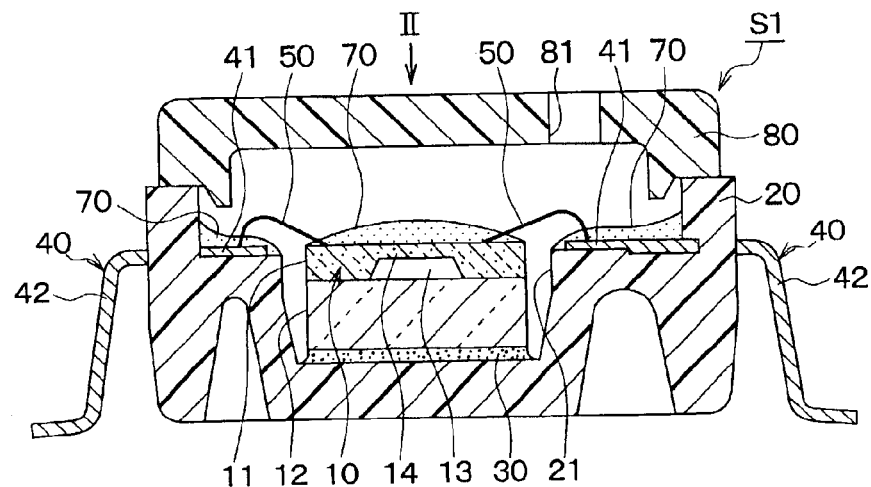
FIG. 1 is a sectional view of a pressure sensor of an embodiment of the present invention.

In an embodiment of the present invention, a pressure sensor is typically used for an atmospheric pressure sensor S1 for detecting the atmosphere pressure. Referring to FIG. 1, a sensor element 10 of the pressure sensor S1 includes a semiconductor substrate 11 such as a silicon substrate and a seat 12 that is made of glass. The substrate 11 has a cavity, so that a pressure reference chamber 13 is provided between the substrate 11 and the seat 12 bonded to each other. Accordingly, the sensor element 10 is provided with the pressure reference chamber 13, and constructs an absolute-pressure detecting element which detects force or pressure applied to an outer surface of its own.

The sensor element 10 forms a diaphragm 14 in the substrate 11 at a portion corresponding to the chamber 13. On the diaphragm 14, gauge resistors (not shown) are formed to constitute a bridge circuit.

On the substrate 11, an amplification circuit (not shown) is formed to be electrically connected with the bridge circuit. When external force acts on the diaphragm 14, the diaphragm 14 is strained and deformed. An electric signal (power voltage) from the bridge circuit due to the strain or the deformation of the diaphragm 14 is amplified to output it in the amplification circuit.

The sensor element 10 is contained in a concavity 21 formed within the package member 20 while the seat 12 of the sensor element 10 is directly adhered on the bottom of the concavity 21 via an adhesive layer 30. Accordingly, the sensor element 10 is held in and fixed to the package member 20.

The package member 20 is formed by molding resin such as polyphenylene sulfide (PPS). The adhesive layer 30, made of resin, has a Young's modulus in a range between $2.45 \times 10^3$ Pa and $2.06 \times 10^4$ Pa (between $2.5 \times 10^{-4}$ kgf/mm$^2$ and $2.1 \times 10^{-3}$ kgf/mm$^2$). The adhesive layer 30 can use a silicon-based adhesive composed of silicon resin. The thickness of the adhesive layer 30 is preferably not less than 110 $\mu$m.

Here, a lead frame 40 is integrally inserted and molded in the package member 20 and externally extends from the concavity 21 of the package member 20.

Figure 2:
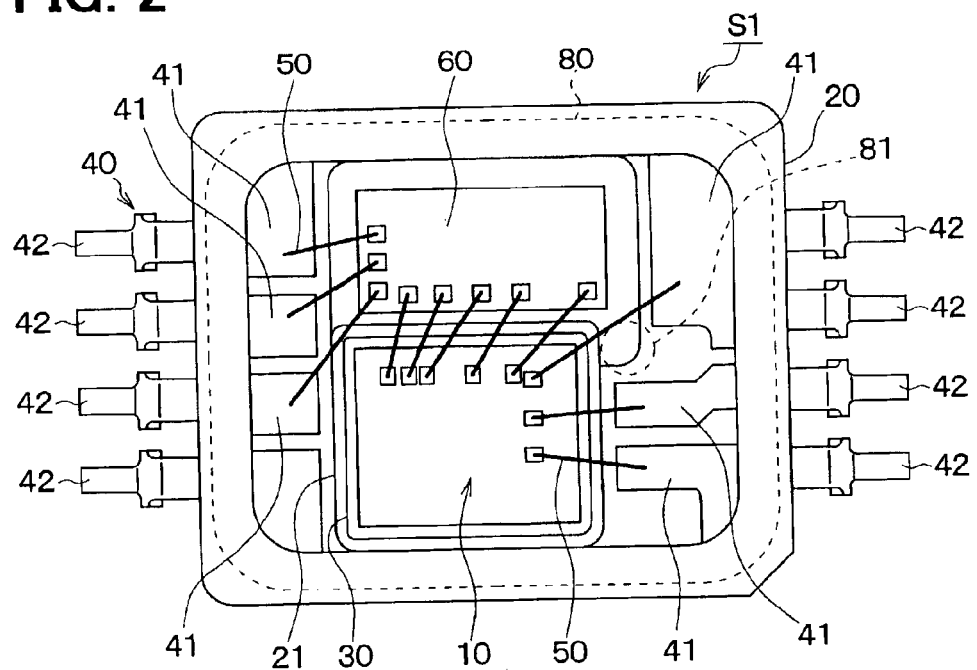
FIG. 2 is a plan view of the pressure sensor of the embodiment taken from arrow II in FIG. 1.

The lead frame 40 is formed by stamping a plate made of, for example, 42-alloy (42% Ni—Fe alloy). The lead frame 40 is provided with a land portion 41 exposed around the concavity 21 within the package member 20, and a lead portion 42 extending outward from the land portion 41 to penetrate through the package member 20. In the embodiment, as illustrated in FIG. 2, the eight lead portions 42 are provided totally in the right and left parts, for example.

The land portion 41 of the lead frame 40 is electrically connected to the sensor element 10 by wire bonding using wires 50 made of a metal such as alumina and gold. Wire-connecting surfaces of the sensor element 10 and the land portion 41 are positioned on the substantially same plane, so that the wire bonding can be readily accurately performed.

The lead portion 42 of the lead frame 40 is connected with an external connecting member (not shown) in the outside of the package member 20. As shown in FIG. 2, the package member 20 is provided with a circuit chip 60 which is electrically connected with the sensor element 10 and the land 41, by the wires 50.

The circuit chip 60 is capable of adjusting an output signal from the sensor element 10. Specifically, the output signal (output voltage) from the sensor element 10 is adjusted by the circuit chip 60 via a wire 50 and externally outputted from a lead frame 40 via a wire 50.

As shown in FIG. 1, the surface of the sensor element 10, the surface of the semiconductor substrate 11 in the sensor element 10, and connecting parts between the land portions 41 of the lead frame 40 and the wires 50 are covered and sealed to be protected by a gel member 70.

A plastic lid 80 is connected to the package member 20, for instance by adhesion at the side of the concavity. The lid 80 seals the sensor element 10, the circuit chip 60 and the wire 50 contained in the package member 20.

The lid 80 is provided with a pressure inlet 81 communicating with the atmosphere. Through the pressure inlet 81 pressure from the atmosphere, that is measuring object, is introduced into a space defined by the lid 80 and the package member 20.

The diaphragm 14 is stressed and deformed due to pressure difference between the introduced atmosphere and the reference chamber 13 in the sensor element 10. The sensor element 10 thus outputs an electric signal as voltage based on the stressed deformation. The output voltage is adjusted by the circuit chip 60 via the wire 50 and is externally outputted.

The above pressure sensor S1 is manufactured as follows. First, the lead frame 40 is fixed in a mold that has an inner shape corresponding to the package member 20 and the inner shape of the mold is filled with resin to form the package member 20 integrated with the lead frame 40. Next, the circuit chip 60 is mounted on the package member 20, the sensor element 10 is fixed to the package member 20 using the adhesive layer 30, and the circuit chip 60 and the sensor element 10 are bonded by the wire bonding using the wires 50. Thereafter the gel member 70 is provided, and the lid 80 is assembled to the package member 20. In addition, an entire surface of the sensor element 10 facing the adhesive layer 30 can be adhered to the package member 20 through the adhesive layer 30 so that a stable Young's modulus of the adhesive layer 30 can be obtained.

In the present invention, the sensor element 10 is directly bonded to the package member 20 by the adhesive layer 30. A main characteristic of the embodiment is that the adhesive layer 30 has a Young's modulus in a range between $2.45 \times 10^3$ Pa and $2.06 \times 10^4$ Pa (between $2.5 \times 10^{-4}$ kgf/mm$^2$ and $2.1 \times 10^{-3}$ kgf/mm$^2$). Maintaining the Young's modulus of the adhesive layer in the above range is to restrict the variation of the sensor characteristic due to the fluctuation of the temperature, and is to improve the performance of the pressure sensor S1. The basis of defining the Young's modulus of the adhesive layer 30 is explained as below.

The thermal hysteresis is a difference in a sensor output at the room temperature (for instance 25° C.) between an initial state and a state after a thermal-history (e.g., after being heated to 120° C.). That is, thermal hysteresis is a phenomenon in which the sensor output fluctuates at the room temperature.

The phenomenon is generated from varying of an output characteristic of the sensor element 10 since a creep strain due to the thermal-history in the package member 20 is applied to the sensor element 10 via the adhesive layer 30. Reduction of the Young's modulus in the adhesive layer 30 therefore relieves a strain from the package member 20 to the sensor element 10 to less affect the sensor characteristic.

The above relation is formulated as a formula (1) below. Here, a force F(p) is applied to the sensor element 10 by the package member 20 while a force F(t) is applied to the sensor element 10 by the adhesive layer 30. A voltage Vout is initially outputted as an initial voltage of the sensor element 10 while a voltage Vout' is outputted as an output of the sensor element 10 which has experienced a thermal-history to vary.

$$\text{Vout}' = \text{Vout} \times F(p)/F(t) \qquad \text{(Formula 1)}$$

Here, the force F(p) depends on material of the package member 20, such as a resinous material that composes the package member 20, while the force F(t) depends on the thickness of the adhesive 30 and the Young's modulus of material of the adhesive 30.

A change amount (change ratio) of the sensor characteristic due to the fluctuating of the temperature is substantially equivalent to a difference between the Vout' and the Vout. The relationship between the Young's modulus of the adhesive layer 30 and the change amount of the sensor characteristic is shown in FIG. 3 by a finite element method (FEM) analysis, for example.

Figure 3:
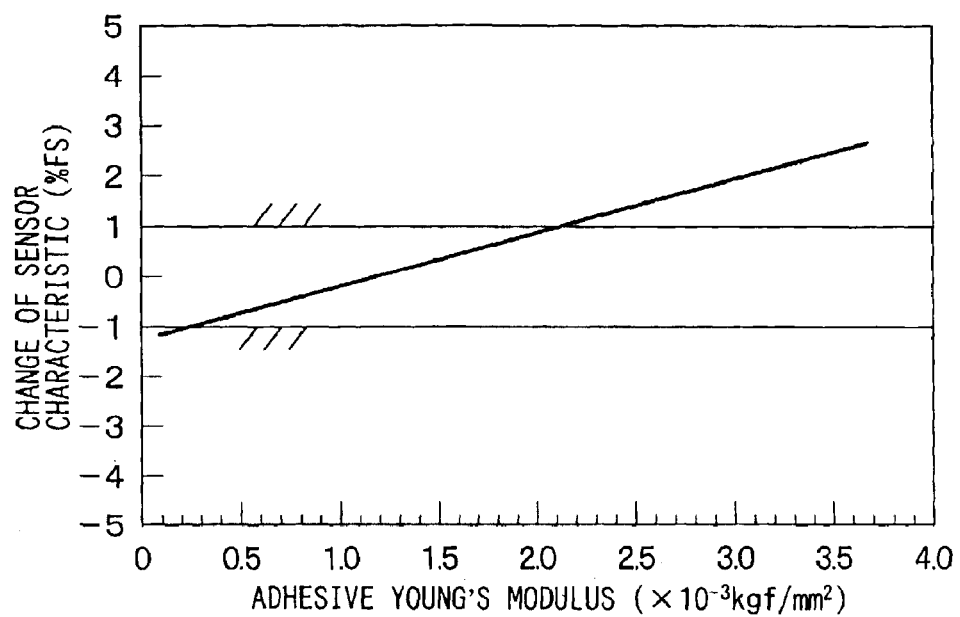
FIG. 3 is a graph showing a relationship between a Young's modulus of an adhesive layer and a change amount of a sensor characteristic.

A vertical axis is the change amount of the sensor characteristic while a lateral axis is the Young's modulus of the adhesive layer 30 in FIG. 3. The change amount of the sensor characteristic is the one at the room temperature after a thermal-history (thermal cycling) in a range between −40° C. and 120° C. The change amount is indicated with a percentage relative to a full scale (FS) of an output voltage of the pressure sensor S1. Here, since the change amount requests high accuracy for an in-vehicle use, an allowed criterion must be within one percent of the full scale.

As shown in FIG. 3, to achieve the change amount within one percent of the full scale, the adhesive layer 30 should have a Young's modulus in a range between $2.45 \times 10^3$ Pa and $2.06 \times 10^4$ Pa (between $2.5 \times 10^{-4}$ kgf/mm$^2$ and $2.1 \times 10^{-3}$ kgf/mm$^2$). Here, in the example illustrated in FIG. 3, material of the package member 20 is PPS while material of the adhesive layer 30 is a silicon-based adhesive and the adhesive layer 30 is 110 μm thick. According to an analysis and experiments by the inventors, other cases, where different materials are used, also have relationship similar to the trend illustrated in FIG. 3.

The stress applied from the package member 20 to the sensor element 10 decreases as the thickness of the adhesive layer 30 becomes thicker. The change amount of the sensor characteristic relative to the thickness of the adhesive layer 30 is thereby analyzed with a FEM analysis as shown in FIG. 4.

Figure 4:
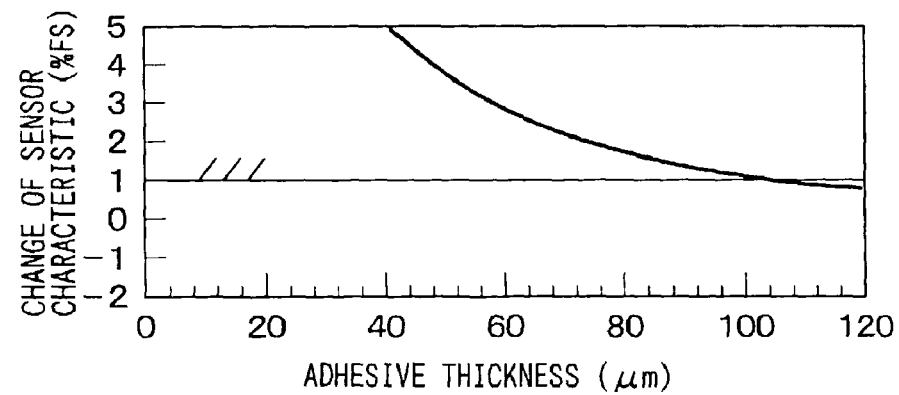
FIG. 4 is a graph showing a relationship between an adhesive layer thickness and a change amount of the sensor characteristic.

The instance illustrated in FIG. 4 is obtained under the most severe condition in which the Young's modulus of the adhesive layer 30 is $2.1 \times 10^{-3}$ kgf/mm$^2$ at which the change is only just in the one percent change in FIG. 3. The result of FIG. 4 exhibits that the adhesive layer of at least 110 μm thickness ensures the change range within one percent of the full scale even if the Young's modulus has the most severe value.

In other words, when an adhesive layer that has a Young's modulus in the above predetermined range and a thickness of more than 110 μm is used, performance of pressure sensor S1 is improved. This pressure sensor S1 effectively restricts the change of the sensor characteristic due to thermal fluctuation.

Figure 5:
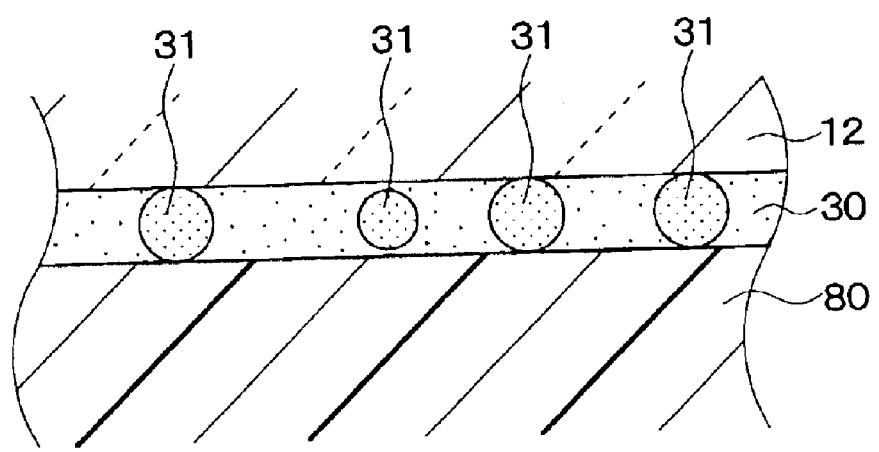
FIG. 5 is an enlarged sectional view of an adhesive layer containing beads.

It is not so easy to ensure as thick as 110 μm adhesive layer by using an adhesive whose Young's modulus is as low as in this embodiment. Therefore, resin beads 31 can be contained in the adhesive layer 30 to ensure the thickness as shown in FIG. 5. Because an excessive addition of the resin beads 31 to the adhesive layer 30 increases the Young's modulus, the added amount of the resin beads 31 is adjusted to maintain the suitable Young's modulus of the adhesive layer 30. Here, resin beads 31 can be made of a material different from the adhesive layer.

A silicon-based hot-cured adhesive (brand name TSE 322) manufactured by Toshiba Silicon Corporation can be used, for example, in the embodiment. The resin beads 31 are inserted in the adhesive (TSE 322) and the adhesive is then hot-cured, so that a Young's modulus of the adhesive layer 30 can be set in the range between $1.5 \times 10^{-3}$ kgf/mm$^2$ and $2.1 \times 10^{-3}$ kgf/mm$^2$.

What is claimed is:

1. A pressure sensor comprising:
    a sensor portion including at least a seat made of glass and a semiconductor sensor element bonded to the seat, the sensor element for outputting an electric signal based on an applied external force;
    a resin package member disposed to support the semiconductor sensor element; and
    an adhesive portion inserted between the sensor portion and the resin package member and having a Young's modulus in a range between $2.45 \times 10^3$ Pa and $2.06 \times 10^4$ Pa, the adhesive portion being formed from an adhesive and a plurality of resin beads contained in the adhesive and having a Young's modulus higher than that of the adhesive.

2. A pressure sensor according to claim 1, wherein the adhesive portion including the plurality of resin beads has a thickness equal to or more than 110 μm.

3. A pressure sensor according to claim 1, wherein the adhesive portion comprises a silicon-based adhesive.

4. A pressure sensor according to claim 1, wherein:
    the seat of the sensor portion has a surface facing the adhesive portion, and
    all of the surface of the seat is adhered to the package member through the adhesive portion.

5. A pressure sensor according to claim 1, wherein the seat of the sensor portion is fixed to the package member by the adhesive portion.

6. A pressure sensor according to claim 1, wherein the seat of the sensor portion is directly fixed to a concave portion formed within a bottom of the resin package member by the adhesive portion.

7. A pressure sensor according to claim 1, wherein the package member is made of polyphenylene sulfide resin.

8. A pressure sensor comprising:
    a sensor portion including a silicon semiconductor substrate bonded to a glass seat, a pressure reference chamber between the substrate and the glass seat, and a diaphragm corresponding to the pressure reference chamber, the diaphragm for outputting an electric signal in accordance with an external force applied thereto;
    a resin package including a concavity for housing the sensor portion; and
    an adhesive having a Young's modulus in a range between $2.45 \times 10^3$ Pa and $2.06 \times 10^4$ Pa and made of a resin material and resin beads contained in the resin material, the resin beads having a Young's modulus higher than that of the resin material, the adhesive directly fixing the seat on a bottom of the concavity.

9. A pressure sensor according to claim 8, wherein the adhesive including the resin material and the resin beads has a thickness of at least 110 μm.

10. A pressure sensor according to claim 8, wherein the adhesive is made of a silicon-based adhesive.

11. A pressure sensor according to claim 8, wherein:
    the seat of the sensor portion has a surface facing the adhesive, and
    all the surface of the seat is adhered to the package through the adhesive.

12. A pressure sensor according to claim 8, wherein the seat of the sensor portion is fixed to the package with the adhesive.

13. A pressure sensor according to claim 8, wherein the package is made of polyphenylene sulfide resin.

* * * * *